(12) United States Patent
Seo et al.

(10) Patent No.: US 8,961,043 B2
(45) Date of Patent: Feb. 24, 2015

(54) LIGHT EMITTING DEVICE PACKAGE AND BACKLIGHT UNIT USING THE SAME

(71) Applicants: LG Electronics Inc., Seoul (KR); LG Innotek Co., Ltd, Seoul (KR)

(72) Inventors: Jung Hoon Seo, Seoul (KR); Jun Ho Jang, Anyang-si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/448,929

(22) Filed: Jul. 31, 2014

(65) Prior Publication Data

US 2014/0340876 A1 Nov. 20, 2014

Related U.S. Application Data

(63) Continuation of application No. 11/526,686, filed on Sep. 26, 2006.

(30) Foreign Application Priority Data

| Sep. 27, 2005 | (KR) | 10-2005-0089927 |
| Dec. 15, 2005 | (KR) | 10-2005-0123897 |
| Feb. 6, 2006 | (KR) | 10-2006-0011056 |
| Feb. 6, 2006 | (KR) | 10-2006-0011060 |

(51) Int. Cl.
*G02B 6/36* (2006.01)
*G02B 6/34* (2006.01)
(Continued)

(52) U.S. Cl.
CPC . *F21V 5/007* (2013.01); *F21K 9/50* (2013.01); *G02F 1/133603* (2013.01); *H01L 33/58* (2013.01); *F21Y 2101/02* (2013.01)

USPC ............... 385/93; 385/14; 385/33; 385/36; 385/88; 359/642; 359/819

(58) Field of Classification Search
CPC ....... G02B 6/43; G02B 6/4214; G02B 6/4292
USPC ................................. 385/14, 88, 93
See application file for complete search history.

(56) References Cited

U.S. PATENT DOCUMENTS

| 5,013,144 A | 5/1991 | Silverglate et al. |
| 6,972,439 B1 | 12/2005 | Kim et al. |

(Continued)

FOREIGN PATENT DOCUMENTS

| CN | 1232297 A | 10/1999 |
| DE | 103 45 515 A1 | 5/2005 |

(Continued)

*Primary Examiner* — Charlie Peng
*Assistant Examiner* — Hung Lam
(74) *Attorney, Agent, or Firm* — Birch, Stewart, Kolasch & Birch, LLP

(57) ABSTRACT

A light emitting device package including light emitting devices, and optical lenses respectively disposed over the light emitting devices. Further, a respective optical lens includes an extending member extending from a body of the respective optical lens, and including a first portion laterally extending in a first direction substantially perpendicular to the central axis of the respective light emitting device, and a second portion extending towards the substrate in a second direction substantially parallel with the central axis of the respective light emitting device. A vertical cross section of the second portion is substantially symmetrical with respect to an axis that is spaced apart in the first direction from and substantially parallel with the central axis of the respective light emitting device.

48 Claims, 17 Drawing Sheets

(51) Int. Cl.
*G02B 6/32* (2006.01)
*G02B 6/12* (2006.01)
*G02B 3/00* (2006.01)
*G02B 7/02* (2006.01)
*F21V 5/00* (2006.01)
*F21K 99/00* (2010.01)
*G02F 1/1335* (2006.01)
*H01L 33/58* (2010.01)
*F21Y 101/02* (2006.01)

(56) References Cited

U.S. PATENT DOCUMENTS

| | | |
|---|---|---|
| 7,210,977 B2 | 5/2007 | Ouderkirk et al. |
| 7,300,183 B2 | 11/2007 | Kiyomoto et al. |
| 7,458,703 B2 | 12/2008 | Han et al. |
| 2001/0019378 A1 | 9/2001 | Yamaguchi |
| 2002/0149312 A1 | 10/2002 | Roberts et al. |
| 2003/0202349 A1 | 10/2003 | Suehiro et al. |
| 2004/0207999 A1* | 10/2004 | Suehiro et al. ............ 362/84 |
| 2004/0262623 A1 | 12/2004 | You |
| 2005/0001537 A1 | 1/2005 | West et al. |
| 2005/0225988 A1 | 10/2005 | Chaves et al. |
| 2006/0083000 A1* | 4/2006 | Yoon et al. ............ 362/311 |
| 2006/0138437 A1 | 6/2006 | Huang et al. |
| 2006/0238884 A1 | 10/2006 | Jang et al. |
| 2006/0291205 A1 | 12/2006 | Jeon |
| 2007/0029563 A1 | 2/2007 | Amano et al. |
| 2007/0047261 A1 | 3/2007 | Thompson et al. |
| 2007/0057268 A1 | 3/2007 | Hamanaka et al. |
| 2007/0195534 A1 | 8/2007 | Ha et al. |

FOREIGN PATENT DOCUMENTS

| | | |
|---|---|---|
| EP | 1 146 572 A2 | 10/2001 |
| JP | 3-127875 A | 5/1991 |
| JP | 2001-156378 A | 6/2001 |
| JP | 2002-111068 A | 4/2002 |
| JP | 2004-172572 A | 6/2004 |
| KR | 10-2000-0036312 A | 7/2000 |
| KR | 10-2002-0047534 A | 6/2002 |
| KR | 10-2005-0031705 A | 4/2005 |
| KR | 10-2005-0097164 A | 10/2005 |
| KR | 10-2005-0103625 A | 11/2005 |
| KR | 10-2005-0113757 A | 12/2005 |

\* cited by examiner

LIGHT EMITTING DEVICE PACKAGE AND BACKLIGHT UNIT USING THE SAME

CROSS-REFERENCE TO RELATED APPLICATIONS

This application is a continuation of co-pending U.S. patent application Ser. No. 11/526,686 filed on Sep. 26, 2006, which claims the benefit of Korean Patent Application Nos. 10-2005-0089927 filed on Sep. 27, 2005, 10-2005-0123897 filed on Dec. 15, 2005, 10-2006-0011056 filed on Feb. 6, 2006, and 10-2006-0011060 filed on Feb. 6, 2006, the entire contents of all of the above applications are hereby incorporated by reference.

BACKGROUND OF THE INVENTION

1. Field of the Invention

This description relates to a light emitting device package and a backlight unit using the same.

2. Discussion of the Related Art

A conventional light emitting diode is optically disposed with a dome-shaped lens, and light is limitedly distributed to within a predetermined region with respect to a central axis. If a light emitting diode is employed to manufacture a liquid crystal display (LCD) for backlight unit, one potential problem is that an even light characteristic cannot be obtained due to light emitting characteristic of the light emitting diode.

It implies that a considerable distance is needed to evenly combine light radiated from the light emitting diode, making it difficult to attain a uniform light characteristic from a thin backlight unit. In other words, a backlight unit using a light emitting diode suffers from a disadvantage of increasing the thickness of an LCD system.

FIG. 1 illustrates a light path from a lateral optical lens according to prior art, where a light emitting diode (LED.10) is disposed inside a dome-shaped lens (20). The dome-shaped lens (20) is formed thereon with an inclined cone-shaped groove (21) and its side is formed with a V-shaped groove (22).

If light emitted from the LED 10 contacts a surface of the cone-shaped groove (21), the light is reflected from the inclined conical groove (21) to be radiated sidewise of the lens. If light contacts the V-shaped groove (22) of the lens (20), the light passes through the lens (20) to be radiated sideways of the lens.

In other words, an LED for laterally emitting (or side-emitting) light (hereinafter referred to as a lateral (side-emission type) LED) according to the prior art serves to laterally radiate light emitted from the LED (10), using a lateral optical lens.

Meanwhile, in the injection-molded lens (20), a region corresponding to an apex (22a) of the V-shaped groove (22) is formed with prominences and depressions (unevenness) if closely looked at (for example, in less than a millimeter unit), such that light of the LED (10) emitted from the region is not radiated sideways of the lens (10) but upwards of the lens (10).

FIG. 2 is a schematic perspective view of an LED package of FIG. 1, where the LED is bonded to a slug, and the slug is disposed at sides thereof with leads (31, 32) which are in turn electrically bonded to the LED.

Furthermore, the LED and the slug are molded by molding means in order to expose a light emitting surface of the LED and the leads (31,32), and the lens (20) of FIG. 1 encompassing the LED is bonded to the molding means.

FIG. 3 is a light emitting distribution table of an LED package according to the prior art, where it shows that a large amount of light is radiated sidewise of the package as indicated in 'a' and 'b' of the distribution table while a small amount of light is radiated through a center of the package as indicated in 'c','d' and 'e' of the distribution table.

FIG. 1 implies that although most of the light is emitted sideways of the lens, some of the light is radiated upwards of the lens. In other words, the LED package thus described cannot implement a perfect light emission to lateral surfaces, such that if it is to be used as a light source for a display, light is partially emitted from the light emitting diode relative to the center of the LED package, bringing about a problem of making an even planar light source.

To be more specific, the partial emission of light relative to the center of the LED package results in creation of so-called light irregularity, referred to as a hot spot phenomenon where spots are generated about a center of pixels displayed on a display, causing degradation of picture quality on the display. FIG. 4 illustrates in detail one of the causes generating the hot spots.

If a size of a light emitting diode (10) is extremely small, an amount of light emitted to a lateral surface of a conventional lens increases by being reflected from a surface (21) of the cone-shaped groove, but if the size of the light emitting diode (10) is extremely large, light (C) progressing at an angle less than a critical angle from the surface (21) of the cone-shaped groove exists to allow the light to be emitted from an upper surface of the lens, thereby generating the appearance of hot spots, because the surface (21) of the cone-shaped groove totally reflects only the light (A) advancing at an angle larger than the critical angle, out of the light irradiated from the light emitting diode (10).

At this time, light (B) progressing to lateral surfaces of the lens has nothing to do with hot spots, as shown in FIG. 4.

FIG. 5 illustrates a cross-sectional view of a light emitting diode packaged in a printed circuit board according to the prior art, where a plurality of lateral light emitting diode packages (50) are packaged in a printed circuit board (60). A printed circuit board packaged with lateral light emitting diode packages is employed for a backlight unit as depicted in FIG. 6.

FIG. 6 is a schematic cross-sectional view of a light emitting diode employed for a liquid crystal display (LCD) for backlight unit according to the prior art.

In order to address the problem of the light emitted to the center of the light emitting diode package, an LCD backlight unit is mounted with a hot spot baffle plate (80). In other words, an LCD backlight unit (90) is configured in such a manner that hot spot baffle plates (80) are mounted on each light emitting diode package (70) packaged in the printed circuit board (60), and a light guide plate (85) is positioned on an upper surface of the hot spot baffle plate (80), and an upper surface distanced from the light guide plate (85) is disposed with an LCD (95) to assemble the backlight unit (90) and the LCD 95.

However, there is a disadvantage in the backlight unit (90) thus constructed in that a plurality of light emitting diode packages (70) must be mounted thereon with hot spot baffle plates (80) called diverters to complicate the fabrication process.

There is another disadvantage in that if there is an erroneous arrangement of the hot spot baffle plates (80) on the plurality of light emitting diode packages (70), spots similar to the hot spots are generated on a screen of a display. Still another disadvantage is that the display panel increases in thickness as much as the hot spot baffle plate (80).

SUMMARY OF THE INVENTION

Accordingly, the present invention is directed to a light emitting device package and a backlight unit using the same that substantially obviates one or more problems due to limitations and disadvantages of the related art.

A first object of the present invention is to provide a light emitting device package and a backlight unit using the same adapted to refract by a lens light advancing upward from the light emitting device package, thereby allowing the light having a uniform intensity to be emitted upwards to the advantage of efficiency and power consumption, even with a small number of light emitting devices.

A second object is to provide an light emitting device package and a backlight unit using the same adapted to cluster a plurality of light emitting devices into one package, thereby allowing light emitted from each light emitting device to smoothly get mixed, and the light mixed by a lens disposed on the light emitting device package to be uniformly emitted upward.

A third object is to provide an light emitting device package and a backlight unit using the same capable of reducing the number of parts, a complicated assembly process and a thickness of a liquid crystal display (LCD) panel.

A fourth object is to provide an light emitting device package and a backlight unit using the same adapted to apply a lens film integrally formed with lens formations capable of uniformly refracting light upward from packages mounted with a plurality of light emitting devices, thereby enabling to remove a process of attaching lenses to each package unit.

A fifth object is to provide an light emitting device package and a backlight unit using the same adapted to use packages mounted with a plurality of light emitting devices for promotion of usage of spaces in a substrate, thereby allowing driving units to be positioned between the packages and enabling to attach heat radiation means on an entire opposite surface of the substrate mounted with packages to the advantage of heat radiation efficiency.

In one general aspect, an light emitting device package comprises: a package body mounted with an light emitting device; and an optical lens attached on an upper surface of the package body having a refracting surface for emitting light emitted from the package body and discharging the light to an outside, and having a recess thereon.

In another general aspect, an light emitting device package and a backlight unit using the same comprises: a substrate; a plurality of light emitting device packages mounted on an upper surface of the substrate; a plurality of optical lenses attached on each upper surface of the light emitting device packages each having a refracting surface for emitting light emitted from the light emitting device packages and discharging the light to an outside, and having a recess thereon; and a diffusion plate disposed on the plurality of optical lenses.

In still another general aspect, an light emitting device package and a backlight unit using the same comprises: a substrate; a plurality of light emitting device packages mounted on an upper surface of the substrate; a lens film disposed on each upper surface of the light emitting device packages and formed with a plurality of optical lens formations each having a refracting surface for emitting light emitted from the light emitting device packages and discharging the light to an outside, and having a recess thereon; and a diffusion plate disposed on the lens film.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Hereinafter, preferred embodiments of the present invention will be described in detail with reference to the accompanying drawings.

Figure 1:
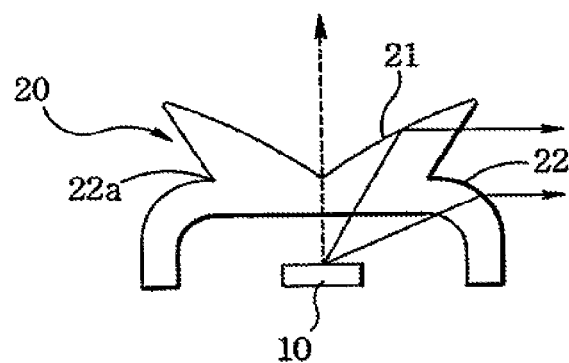
FIG. 1 illustrates a light path from a lateral optical lens according to prior art.
Figure 2:
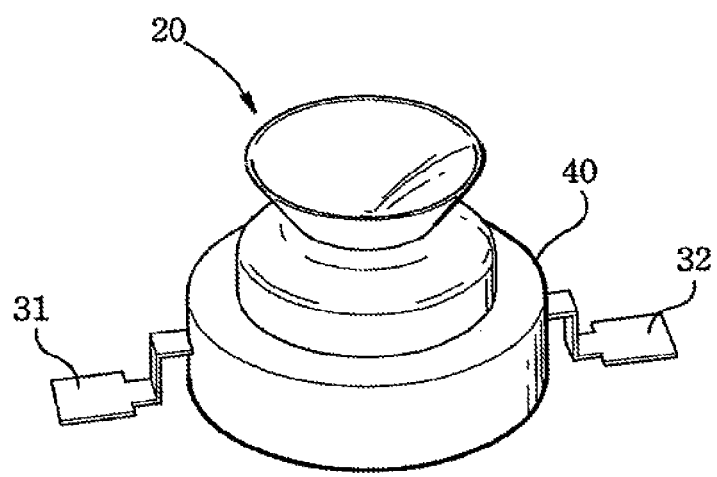
FIG. 2 is a schematic perspective view of a light emitting device package of FIG. 1.
Figure 3:
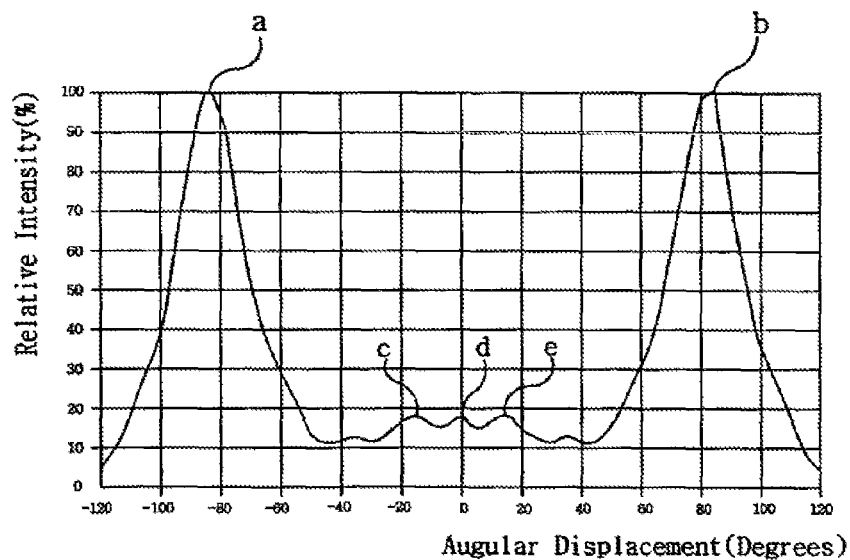
FIG. 3 is a light emitting distribution table of an light emitting device package according to the prior art.
Figure 4:
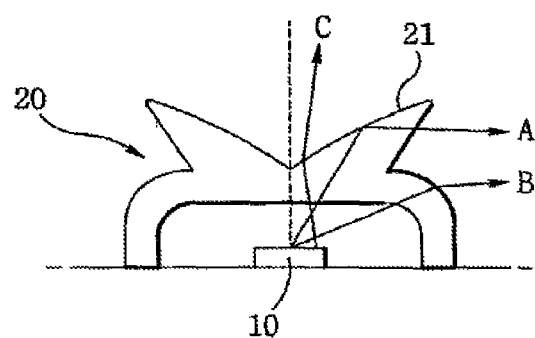
FIG. 4 illustrates in detail one of the causes generating the hot spots in an optical lens according to the prior art.
Figure 5:
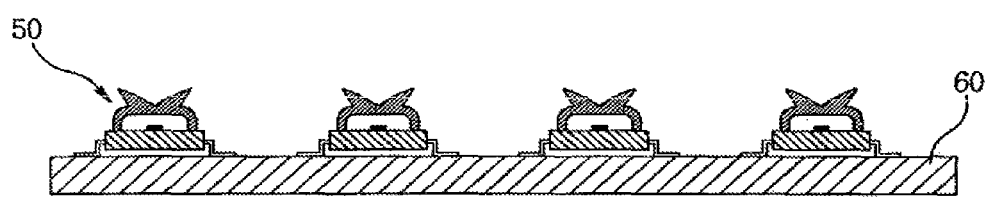
FIG. 5 illustrates a cross-sectional view of a light emitting diode packaged in a printed circuit board according to the prior art.
Figure 6:
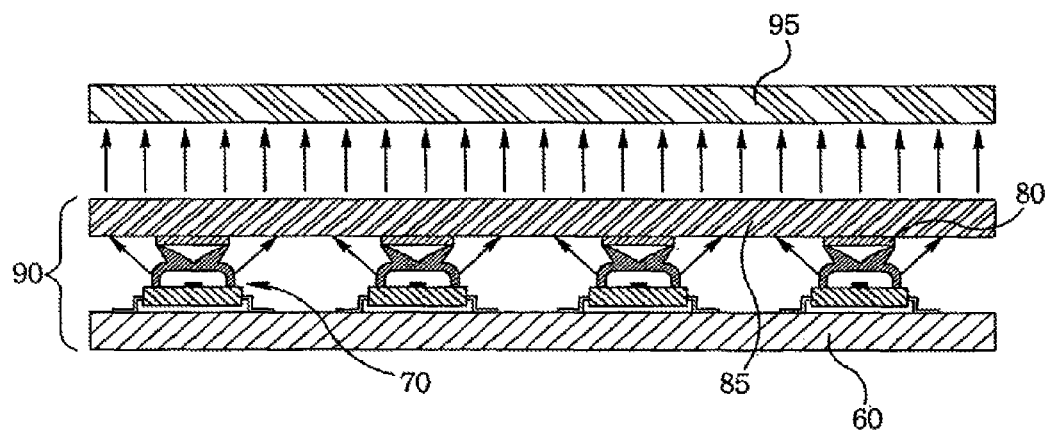
FIG. 6 is a schematic cross-sectional view of a light emitting diode employed for a liquid crystal display (LCD) for backlight unit according to the prior art.
Figure 7:
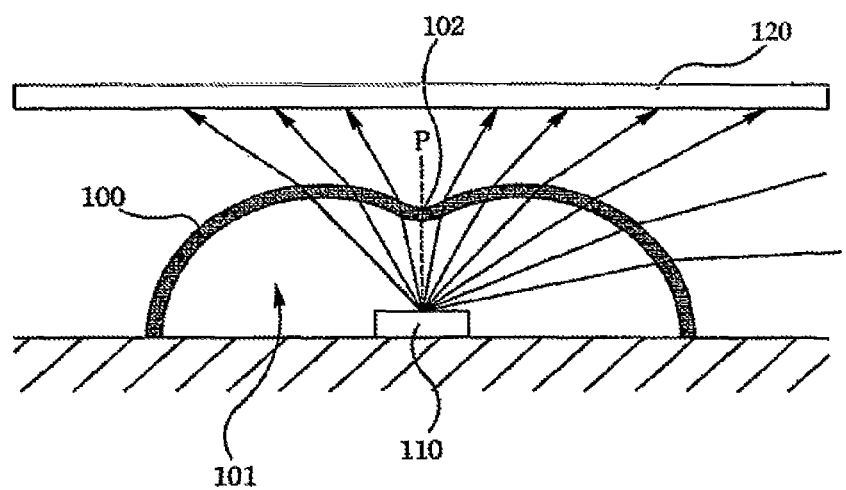
FIG. 7 is a cross-sectional view illustrating a light path via an optical lens according to the present invention.

Referring to FIG. 7, an optical lens (100) according to the present invention is disposed therein with a hollow part (101) into which an light emitting device (110) for emitting light can be positioned, a surface for refracting the light emitted from the light emitting device (110) and discharging to an outside, and a recess (102) disposed thereon. Preferably, but not necessary, the optical lens (100) has a shape of a bulging cap, and the recess (102) is formed at an upper region positioned on a central axis (P) of the cap.

Referring again to FIG. 7, if the light emitting device (110) is disposed inside the optical lens (100), the light irradiated from the light emitting device (110) is refracted from the optical lens (100) to be discharged to an outside. The recess (102) formed on an upper surface of the optical lens (100) serves to change the shape of the optical lens (100) to refract the light advancing the upper side of the light emitting device (110).

Typically, a side-emission type light emitting device is in use for an LCD backlight having a light path sideways because intensity of the light advancing upward is too strong, but the present invention can equalize the intensity of the light irradiated from the diffusion plate (120) by refracting the light progressing upward from the light emitting device packages. FIG. 7 illustrates a track where the light irradiated from the light emitting device (110) inside the optical lens (100) is refracted by the optical lens (100) to be evenly incident on the diffusion plate (120).

Figure 8:
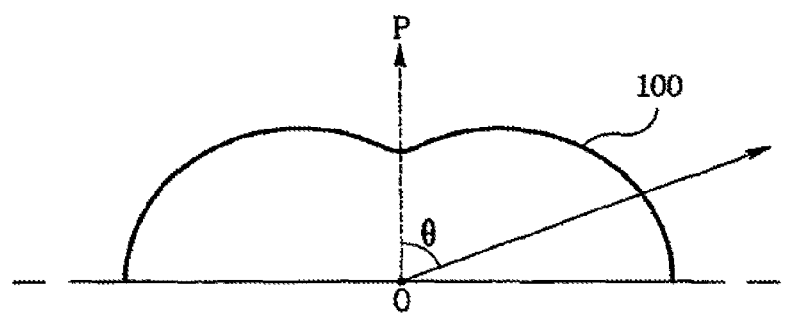
FIG. 8 is a cross-sectional view illustrating a light path via an optical lens according to the present invention.

Now, referring to FIG. 8, assuming that a position inside the optical lens (100) from which light is irradiated on a central axis (P) is given as 'O', the light irradiated to a path up to 80 degrees is refracted from the optical lens (100) to advance upward. However, the light emitted from 80 degrees to 90 degrees based on the central axis (P) of the optical lens (100) does not advance upward, even if it is refracted from the optical lens (100), only to advance to a lateral surface of the optical lens (100).

Figure 9:
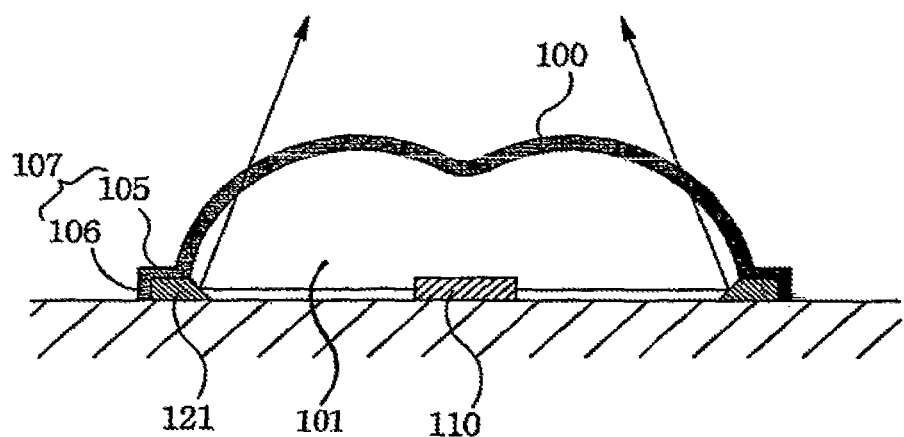
FIG. 9 is a cross-sectional view illustrating a light path where a reflection structure is attached to a guide extension of an optical lens according to the present invention.

FIG. 9 is a cross-sectional view illustrating a light path where a reflection structure is attached to a guide extension of an optical lens according to the present invention, where a portion of the optical lens (100) is opened to allow the hollow part (101) therein to communicate with an outside, and a tip end of the opened portion is connected to a guide extender (107).

The guide extender (107) includes a first extender (105) horizontally extended to a tip end of the optical lens (100) and a second extender (106) vertically extended to the first extender (105). The guide extender (107) is so formed as to facilitate an easy installation of the optical lens (100) to the light emitting device package.

The guide extender (107) is disposed therein with an inclined ring-shaped reflection structure (121) to allow the light irradiated from the lateral surface of the light emitting device (110) to be transmitted upward as shown in FIG. 9.

Figure 10:
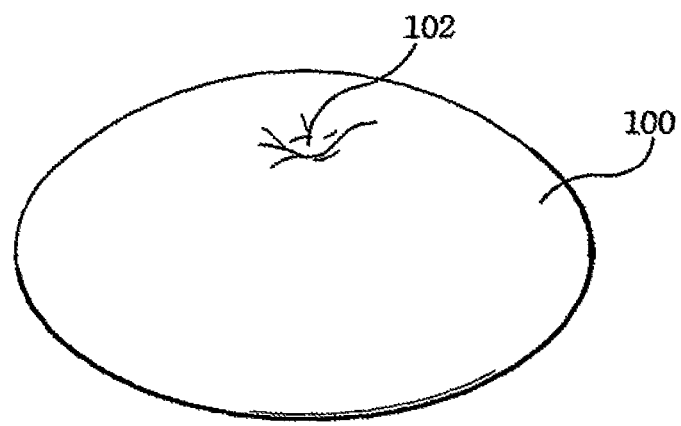
FIG. 10 is a perspective view of an optical lens according to the present invention.

Referring to FIG. 10, the optical lens (100) is formed thereon with a curved recess (102) for refracting the light inside the optical lens (100). The optical lens (100) may be curvedly or slantingly formed in order to transmit the light upward with a uniform intensity.

Figure 11:
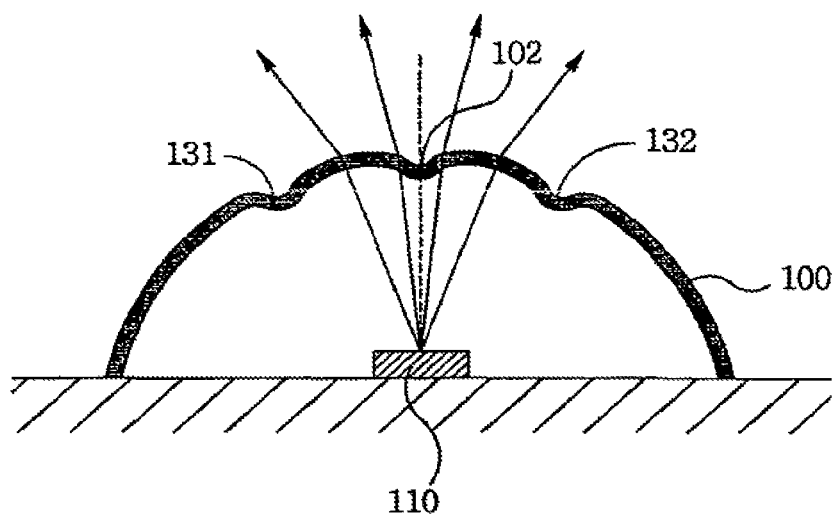
FIG. 11 is a cross-sectional view illustrating a light path via an optical lens formed thereon with a plurality of recesses.

FIG. 11 is a cross-sectional view illustrating a light path via an optical lens formed thereon with a plurality of recesses, where the optical lens (100) is formed thereon with an array of recesses (131, 132), each recess spaced a predetermined distance apart, and the optical lens (100) is made to receive a uniform intensity of light thereon.

Figure 12:
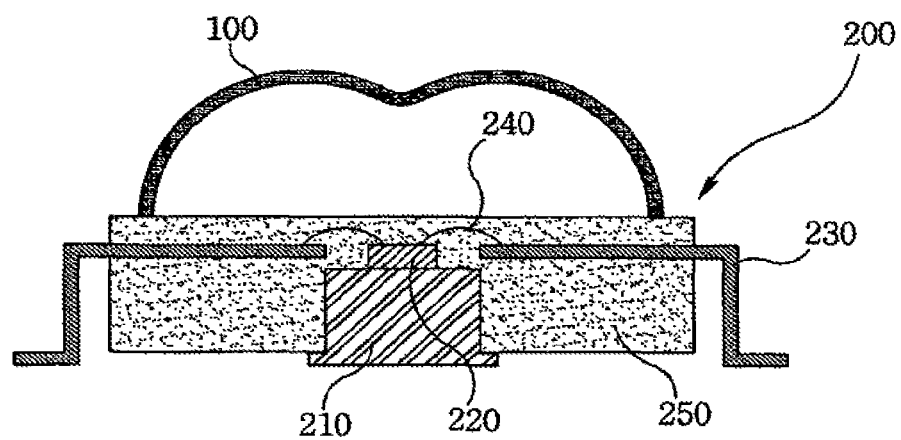
FIG. 12 is a schematic cross-sectional view illustrating a light emitting device package mounted with an optical lens according to the present invention.

FIG. 12 is a schematic cross-sectional view illustrating an light emitting device package mounted with an optical lens, where a package body (200) fabricated with a light emitting device is attached thereon with the optical lens (100). The package body (200) comprises a heat slug (210. i.e., a heat conducting part); an light emitting device (220) bonded to an upper surface of the heat slug (210); leads (230) electrically connected to the light emitting device (220); and molding apparatus (250) encompassing the light emitting device (220) and a part of the leads (230) and exposing a bottom surface of the heat slug (210). At this time, a wire (240) electrically connects the light emitting device (220) and the leads (230), as shown in FIG. 12.

Figure 13:
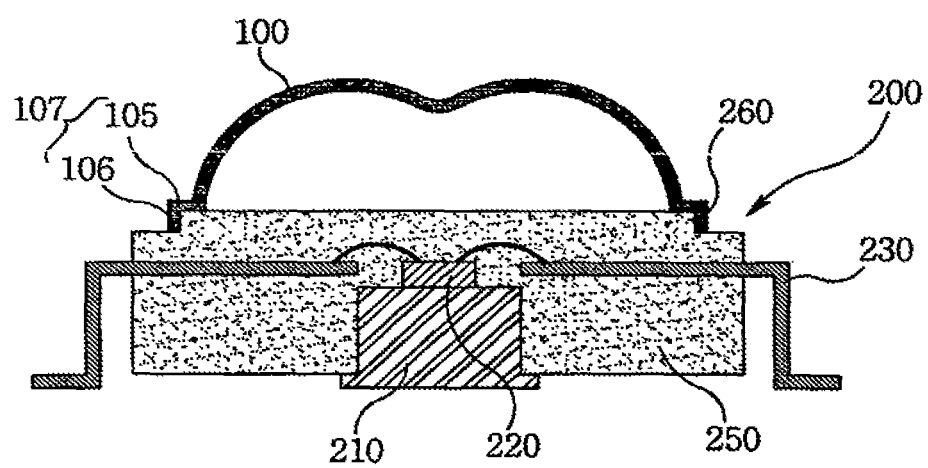
FIG. 13 is a schematic cross-sectional view illustrating a state where a lug of a light emitting device package is inserted into a guide extender of an optical lens according to the present invention.

FIG. 13 is a schematic cross-sectional view illustrating a state where a lug of an light emitting device package is inserted into a guide extender of an optical lens, where the optical lens (100) disposed with the guide extender (107) and a package disposed with a projection (260) are prepared for the fabricating process. Successively, the lug (260) on the package is inserted into an inside of the guide extender (107). The lug (260) of the package and the guide extender (107) of the optical lens (100) may be bonded by adhesive means.

Figure 14:
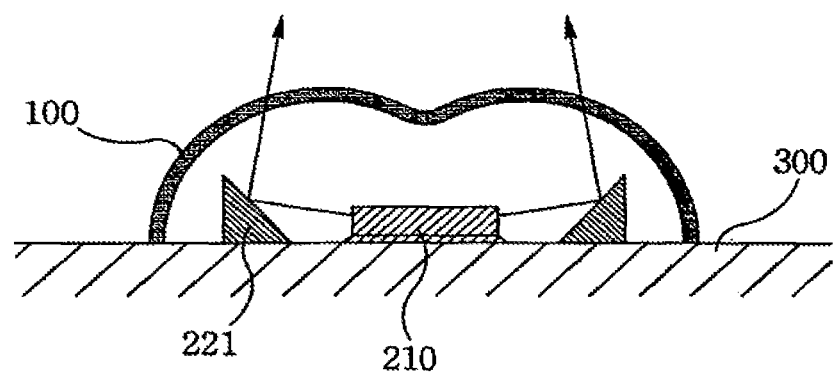
FIG. 14 is a schematic cross-sectional view illustrating a package where an optical lens is mounted on a substrate according to the present invention.

FIG. 14 is a schematic cross-sectional view illustrating a package where an optical lens is mounted on a substrate, where ring-shaped reflection structures (221) are attached on an upper surface of a substrate (300), and an light emitting device (210) is bonded to the upper surface of the substrate (300) exposed between the reflection structures (221), and the optical lens (100) is bonded to an upper surface of the substrate (300) outside of the reflection structures (221).

Light laterally emitted from the light emitting device (210) in the package thus formed is reflected from the reflection structures (221), transmitted upward and prevented from being lost.

Referring back to FIG. 8, the light irradiated from the light emitting device on a path of 80-90 degrees cannot advance upward even if refracted by the lens for the light emitting device, but advance to a radial lateral direction from the optical lens, such that the reflection structures (221) can radiate upward the light advancing sideways to thereby enable to reduce the loss of the light.

In other words, each of the reflection structures (221) has an inclination capable of reflecting the light emitted on a path of 80-90 degrees from the central axis (P) of the optical lens (100) and advancing the light upward of the optical lens (100).

Figure 15:
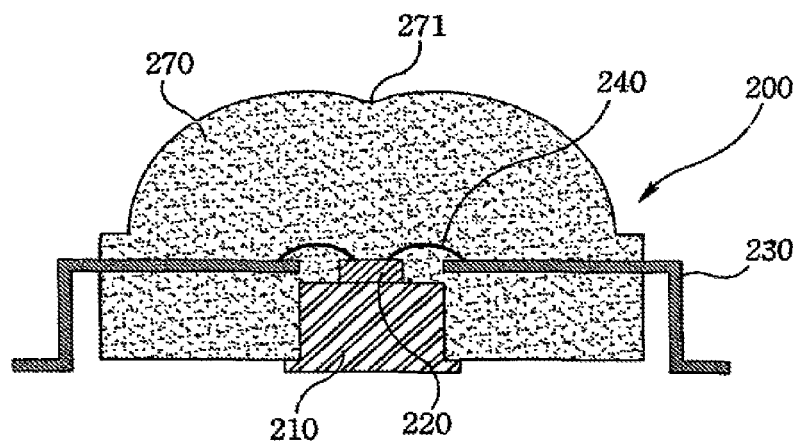
FIG. 15 is a schematic cross-sectional view illustrating a package where a molding apparatus is formed with an optical lens formation according to the present invention.

FIG. 15 is a schematic cross-sectional view illustrating a package where a molding apparatus is formed with an optical lens formation, the package includes a heat slug (210), a light emitting device (220) bonded to an upper surface of the heat slug (210), leads (230) bonded to the light emitting device (220) and a wire (240), and a molding unit (270) encompassing the light emitting device (220), the wire (240) and a part of the leads (230), and exposing a bottom surface of the heat slug (210) and formed thereon with a lug of an optical lens formation. As mentioned above, the optical lens is disposed with a surface for refracting light radiated from the light emitting device (100) and discharging the light to an outside, and is also formed thereon with a recess (271).

Figure 16A:
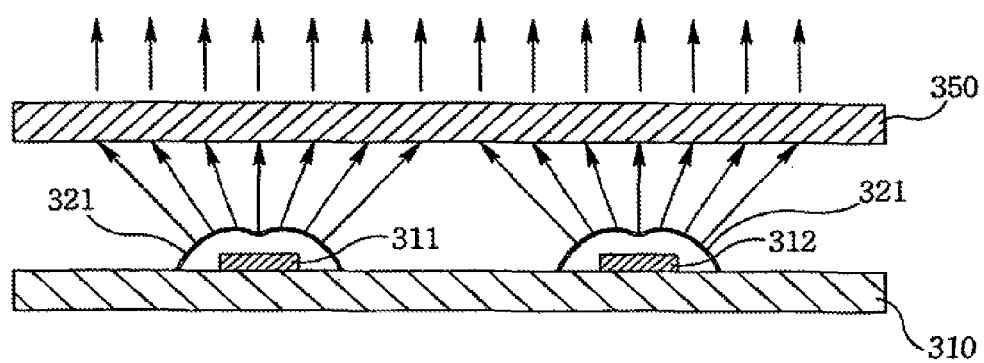
FIGS. 16a and 16b are schematic cross-sectional views illustrating a backlight unit using an light emitting device mounted with an optical lens according to the present invention.
Figure 16B:
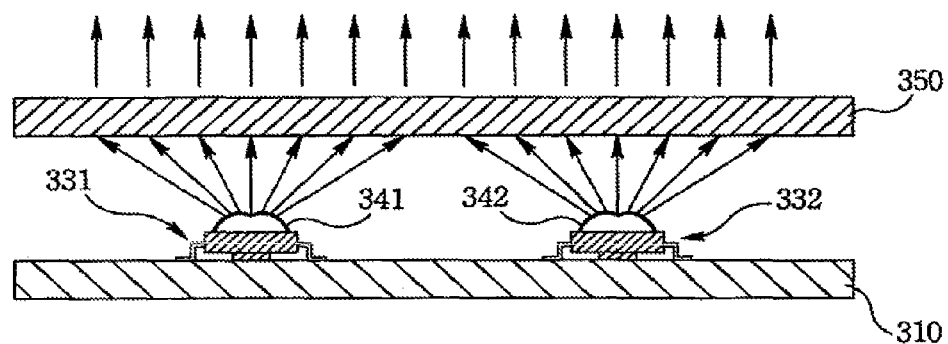

FIGS. 16*a* and 16*b* are schematic cross-sectional views illustrating a backlight unit using a light emitting device mounted with an optical lens. As depicted in FIG. 16*a*, the backlight unit comprises: a substrate (310); a plurality of light emitting devices (311, 312) attached on an upper surface of the substrate (310); a plurality of optical lenses (321), each lens formed with a surface disposed therein with a hollow part for refracting light radiated from the light emitting devices and discharging the light to an outside, and also formed thereon with a recess with each hollow part disposed therein with light emitting device and bonded to the substrate (310); and a diffusion plate (350) disposed above the plurality of optical lenses (321).

Now, referring to FIG. 16*b*, the backlight unit comprises: a substrate (310); a plurality of light emitting device packages (331, 332) attached on an upper surface of the substrate (310); a plurality of optical lenses (341, 342) disposed with a surface formed with a hollow part therein for refracting light radiated from the light emitting device packages (331,332) and discharging the light to an outside, and also formed thereon with a recess, and bonded to the light emitting device packages (331,332); and a diffusion plate (350) disposed above a plurality of optical lenses (341, 342). The substrate (310) is preferred to be formed in MCPCB (Metal Core PCB) or MPCB (Metal PCB).

The backlight unit is advantageously operated in such a manner that the light advancing upwards of the light emitting devices or the light emitting device packages is refracted and discharged upwards of the light emitting devices or the light emitting device packages with a uniform intensity, whereby a large area can be uniformly illuminated, even with only a small number of light emitting devices or light emitting device packages, thereby enabling to improve the backlight light efficiency and power consumption efficiency.

Figure 17A:
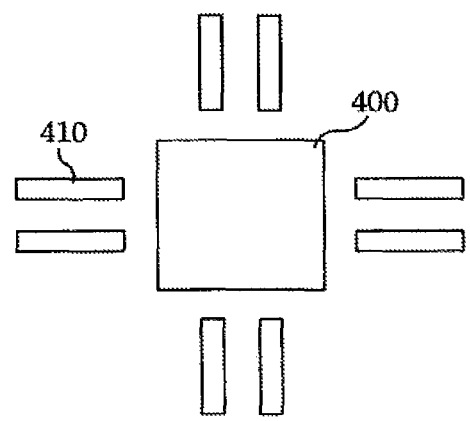
FIGS. 17a-17e are schematic plans for manufacturing an light emitting device package mounted with an optical lens according to an embodiment of the present invention.
Figure 17B:
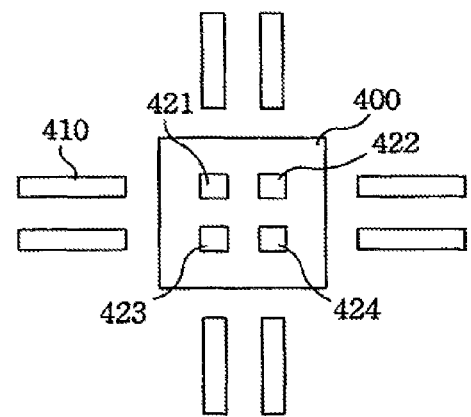
Figure 17C:
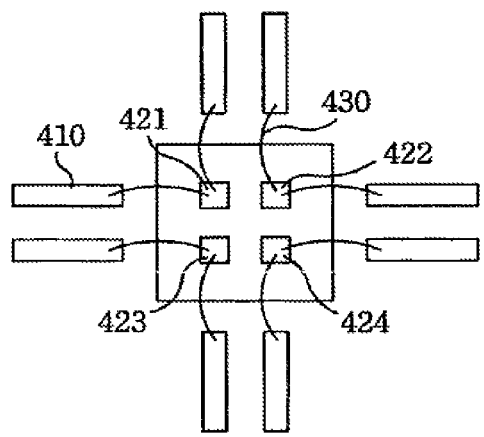
Figure 17D:
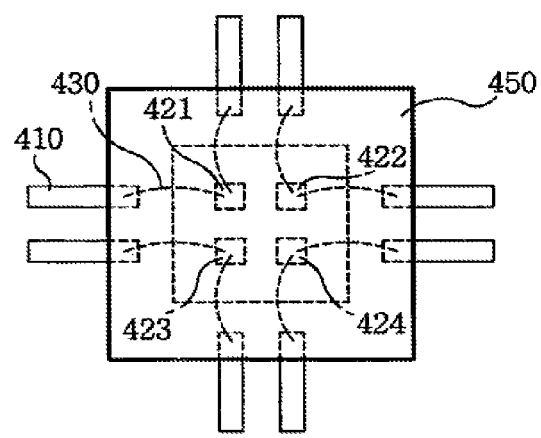
Figure 17E:
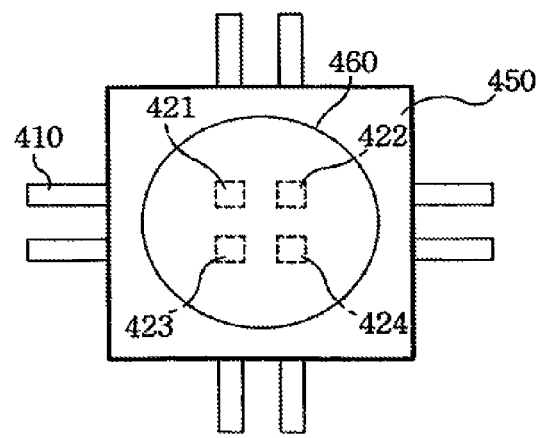

FIGS. 17*a* and 17*e* are schematic plans for manufacturing a light emitting device package mounted with an optical lens according to an embodiment of the present invention. First, a mounting plate (400) and a lead frame are prepared, the lead frame including a plurality of leads (410) distanced from the mounting plate (400), as shown in FIG. 17*a*. The lead frame includes a conventional structure and may be variably designed and modified, but the plurality of leads (410) must satisfy a requirement that they be distanced from the mounting plate (400). At the same time, the plurality of leads (410) must be positioned about the mounting plate (400), as illustrated in FIG. 17*a*.

Successively, a plurality of light emitting devices (421, 422, 423, 424) are bonded to an upper surface of the mounting plate (400) (FIG. 17*b*). Preferably, the plurality of light emitting devices (421,422, 423, 424) are horizontally structured to allow electrodes to be formed thereon. The plurality of light emitting devices (421, 422, 423, 424) and a plurality of leads (410) are electrically connected (FIG. 17*c*). At this time, the plurality of light emitting devices (421, 422, 423, 424) and a plurality of leads (410) are electrically connected via a wire, as depicted in FIG. 17*c*. Thereafter, a molding apparatus (450) is formed for encompassing the plurality of light emitting devices (421, 422, 423, 424) and parts of the plurality of leads (410) (FIG. 17*d*). Lastly, a lens is bonded to an upper surface of the molding apparatus (450), the lens formed with a surface for refracting light radiated from the plurality of light emitting devices (421, 422, 423, 424) and discharging the light to an outside, and formed thereon with a recess (FIG. 17*e*).

Figure 18:
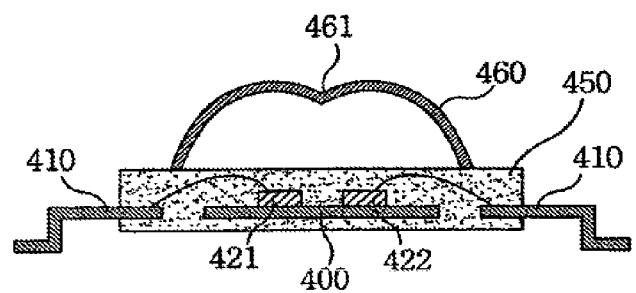
FIG. 18 is a schematic cross-sectional view illustrating an light emitting device package mounted with an optical lens according to an embodiment of the present invention.

FIG. 18 is a schematic cross-sectional view illustrating an light emitting device package mounted with an optical lens according to an embodiment of the present invention. The light emitting device package comprises: a mounting plate (400); a plurality of leads (410) each spaced a predetermined distance apart from the mounting plate (400); a plurality of light emitting devices (421, 422, 423, 424) bonded to an upper surface of the mounting plate (400); a conductive body for electrically connecting the plurality of light emitting devices (421, 422, 423, 424) to the plurality of leads (410); a molding apparatus (450) encompassing the plurality of light emitting devices (421, 422, 423, 424) and parts of the plurality of leads (410); ); and an optical lenses (460) formed with a surface for refracting light radiated from the plurality of light emitting devices (421, 422, 423, 424) and discharging the light to an outside, and also formed thereon with a recess (461) and bonded to the upper surface of the molding apparatus (450). The conductive body is a wire. Thus, the light radiated from the clustered plurality of light emitting devices as on package is mixed to be uniformly irradiated upward by the lens disposed on the upper surface of the package.

Figure 19:
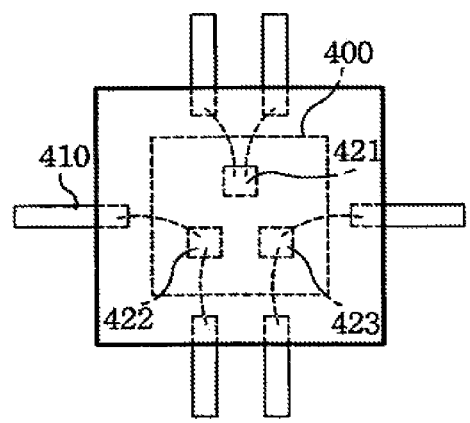
FIG. 19 is a schematic plan illustrating a state where three light emitting devices are mounted on an light emitting device package according to an embodiment of the present invention.

FIG. 19 is a schematic plan illustrating a state where three light emitting devices are mounted in a light emitting device package according to an embodiment of the present invention, where it can be noted that three light emitting devices (421, 422, 423) fabricated in the mounting plate (400) is molded to form a package.

Figure 20:
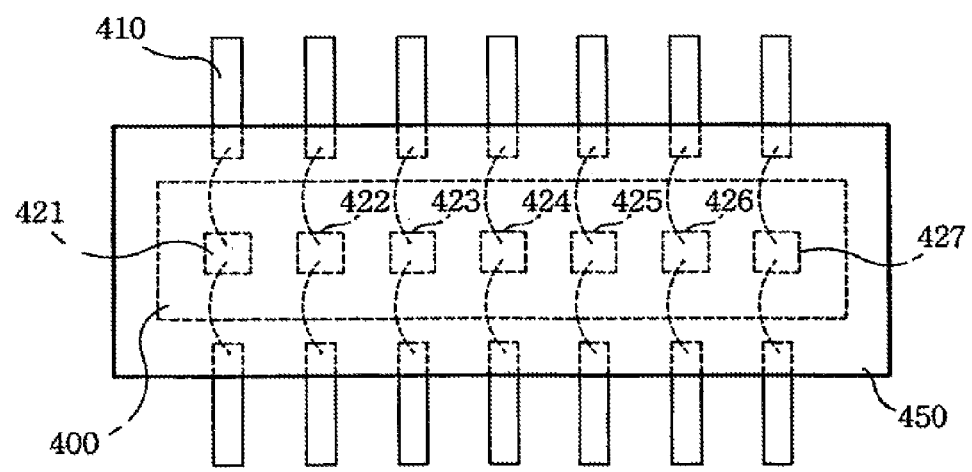
FIG. 20 a schematic plan illustrating a rectangular light emitting device package according to the present invention.

FIG. 20 a schematic plan illustrating a rectangular light emitting device package according to the present invention, where the mounting plate (400) is fabricated thereon in series with seven light emitting devices (421, 422, 423, 424, 425, 426,427), each light emitting device spaced a predetermined distance apart, a plurality of leads (410) discretely arranged at both sides of the mounting plate (400) are bonded by the light emitting devices (421, 422, 423, 424, 425, 426,427) via a wire (430), and the plurality of leads (410), the mounting plate (400) and the light emitting devices (421, 422, 423, 424, 425, 426,427) are encompassed by the molding apparatus (450). The light emitting device package is fabricated with light emitting devices in series to allow forming in a rectangular shape.

Figure 21:
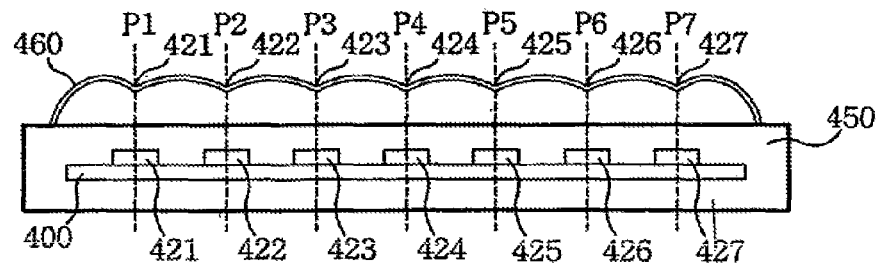
FIG. 21 a schematic plan illustrating a state where a lens is mounted to the light emitting device package of FIG. 20.

FIG. 21 a schematic plan illustrating a state where a lens is mounted to the light emitting device package of FIG. 20, where recesses (421,422,423,424, 425, 426, 427) are formed on an upper surface of an optical lens (460) on central axes (P1, P2, P3, P4, P5, P6, P7) of the light emitting devices (421, 422, 423, 424, 425, 426,427), each light emitting device discretely fabricated in series. Therefore, the rectangular package is attached with lenses formed with recesses on central axes of each light emitting device, such that light emitted from each light emitting device can be uniformly radiated upward.

Figure 22A:
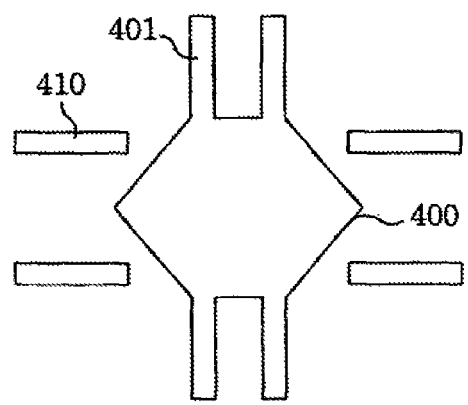
FIGS. 22a-22e are schematic plans for manufacturing an light emitting device package mounted with an optical lens according to another embodiment of the present invention.
Figure 22B:
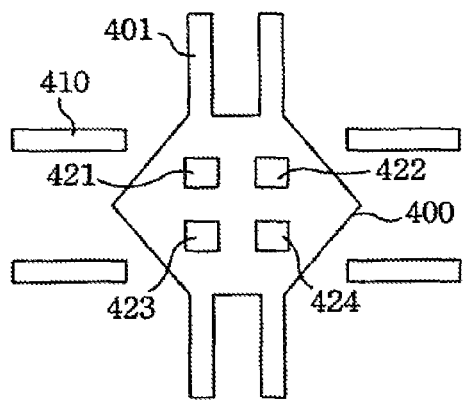
Figure 22C:
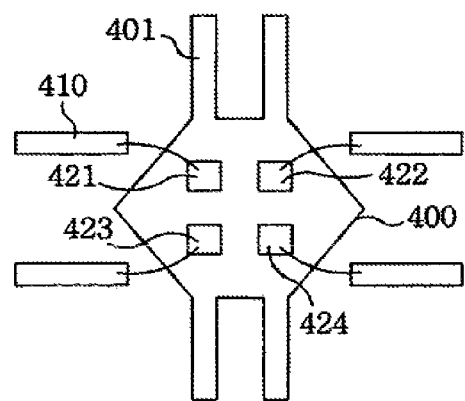
Figure 22D:
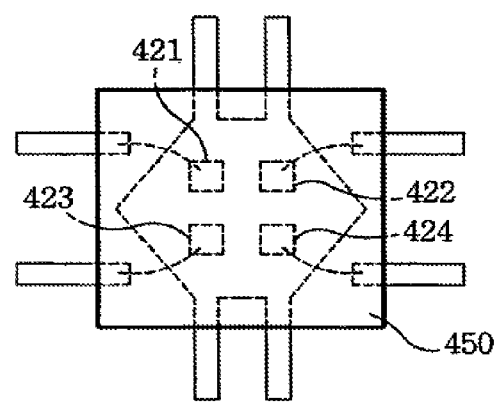
Figure 22E:
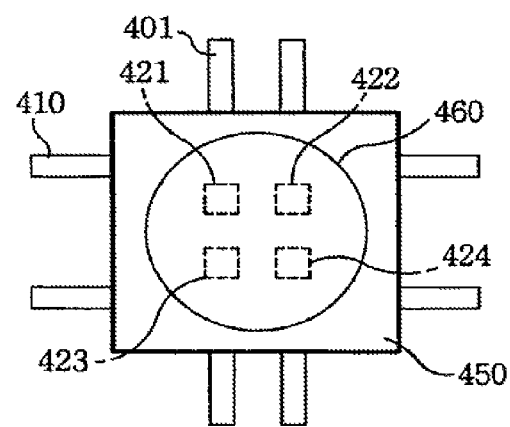

FIGS. 22*a* and 22*e* are schematic plans for manufacturing a light emitting device package mounted with an optical lens according to another embodiment of the present invention. A mounting plate (400) and a lead frame are first prepared, where the lead frame includes a plurality of leads (410) each spaced a predetermined distance apart from the mounting plate (400) and a plurality of leads (401) extended to the mounting plate (400) (FIG. 22*a*). Next, a plurality of light emitting devices (421, 422, 423, 424) is bonded on an upper surface of the mounting plate (400) (FIG. 22*b*). In other words, the light emitting devices employed in the package according to the present exemplary embodiment are preferably vertical light emitting devices formed with electrodes thereon and thereunder.

Successively, the plurality of leads (410) discretely arranged from the mounting plate (400) are electrically connected to the light emitting devices (421, 422, 423, 424) (FIG. 22*c*). Thereafter, a molding apparatus (450) is formed to encompass the plurality of light emitting devices (421, 422, 423, 424) and parts of the plurality of leads (410) (FIG. 22*d*). Lastly, the optical lens (460) formed with a surface for refracting light radiated from the plurality of light emitting devices (421, 422, 423, 424) and discharging the light to an outside, and also formed thereon with a recess (461) is bonded to the upper surface of the molding apparatus (450) (FIG. 22*e*).

As a result, the light emitting device package according to another embodiment of the present invention comprises: a mounting plate (400) mounted with a plurality of leads (401); a plurality of leads (410) each spaced a predetermined distance apart from the mounting plate (400); a plurality of light emitting devices (421, 422, 423, 424) bonded to an upper surface of the mounting plate (400); a conductive body for electrically connecting the plurality of light emitting devices (421, 422, 423, 424) to the plurality of leads (410); a molding apparatus (450) encompassing the plurality of light emitting devices (421, 422, 423, 424) and parts of the plurality of leads (410); and an optical lenses (460) formed with a surface for refracting light radiated from the plurality of light emitting devices (421, 422, 423, 424) and discharging the light to an outside, and also formed thereon with a recess (461) and bonded to the upper surface of the molding apparatus (450).

At this time, a structure including the mounting plate (400), the leads (410), the light emitting devices (421, 422, 423, 424), and the molding apparatus (450) comprises a package body, where the optical lens (460) is excluded.

Consequently, the light emitting device package according to another embodiment of the present invention is such that, as the light emitting devices are mounted and electrically connected to the mounting plate, only one time of wire bonding is performed for each light emitting device.

Figure 23:
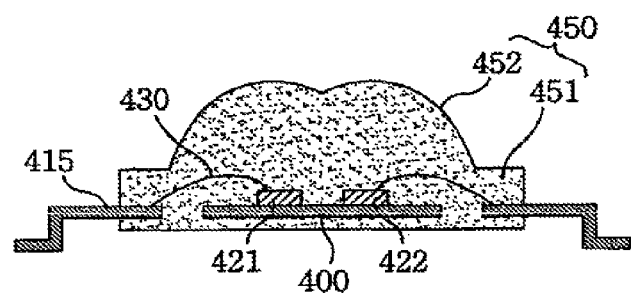
FIG. 23 is a schematic cross-sectional view illustrating an light emitting device package formed with a molding apparatus disposed with another optical lens formation in the processes of FIGS. 17d and 22d.

FIG. 23 is a schematic cross-sectional view illustrating an light emitting device package formed with a molding apparatus disposed with another optical lens formation in the processes of FIGS. 17*d* and 22*d*.

There is an advantage in the light emitting device package according to FIG. 23 in that the foregoing processes of separately manufacturing an optical lens and bonding the optical lens in FIGS. 17*d* and 22*d*, can be dispensed with when the molding apparatus is formed and the optical lens formation is formed on the molding apparatus. As a result, the optical lens is integrally formed with the molding apparatus and molded with the same material as that of the molding apparatus. In other words, the formation of the molding apparatus (451) encompassing the mounting plate (400), the light emitting devices (421, 422), the wire (430) and parts of the leads (415) and the formation of the optical lens (452) can be integrally performed by one-time molding process.

Figure 24A:
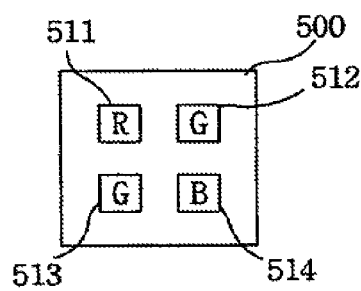
FIGS. 24a and 24b are schematic plans illustrating a state where an light emitting device package is mounted with light emitting devices according to the present invention.
Figure 24B:
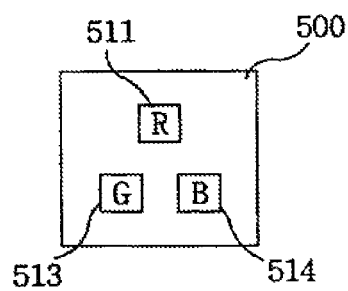

FIGS. 24*a* and 24*b* are schematic plans illustrating a state where an light emitting device package is mounted with light emitting devices according to the present invention.

First of all, as shown in FIG. 24*a*, a mounting plate (500) is mounted thereon with four light emitting devices. In other words, a first row is arrayed with a red (R) light emitting device (511), and a green (G) light emitting device (512), while a second row is arrayed with a green (G) light emitting device (513) and a blue (B) light emitting device (514).

Referring now to FIG. 24*b*, the mounting plate (500) is fabricated thereon with three light emitting device. In other words, a first row is arrayed with a red (R) light emitting device (511), and a second row is arrayed with a green (G) light emitting device (513) and a blue (B) light emitting device (514). The purpose of packaging four light emitting devices in the RGGB array, and three light emitting devices in the RGB array is to cluster the light emitting devices for fabrication in an effort to embody white light in one package.

Figure 25:
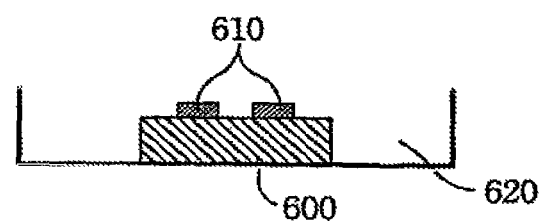
FIG. 25 is a schematic plan illustrating a shape of a mounting plate of a light emitting device package according to the present invention.

Meanwhile, it is preferred that the package in the present invention be constructed with one of the red, green and blue light emitting devices or with all the light emitting devices. As a result, light irradiated from the plurality of light emitting devices via an optical lens disposed on an upper surface of the package can be mixed and uniformly emitted upwards. FIG. 25 is a schematic plan illustrating a shape of a mounting plate of a light emitting device package according to the present invention.

As illustrated in FIG. 25, a mounting plate (600) is thickly formed to allow a bottom surface of a mounting plate (600) to be exposed to a molding apparatus (620), thereby enabling to discharge heat generated from the light emitting devices (610) packaged on the mounting plate (600) to the mounting plate (600). In other words, the mounting plate (600) functions as a heat sink for conducting the heat away from the light emitting devices.

Figure 26A:
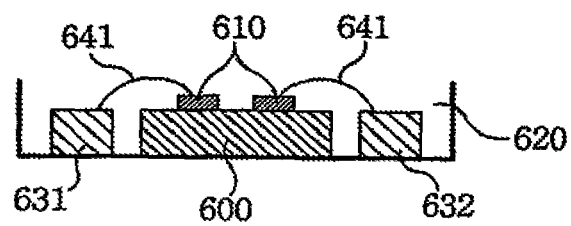
FIGS. 26a and 26b are schematic plans illustrating shapes of leads of a light emitting device package according to the present invention.
Figure 26B:
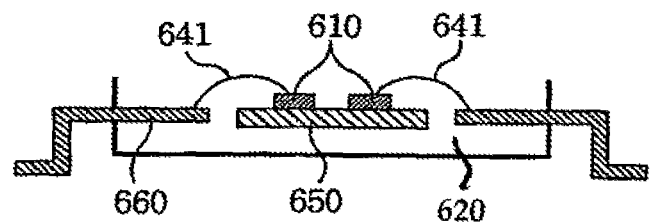

FIGS. 26*a* and 26*b* are schematic plans illustrating shapes of leads of an light emitting device package according to the present invention.

Referring to FIG. 26*a*, a part of a lead in a light emitting device package is exposed to a lower surface of the molding apparatus (620), thereby enabling to discharge heat generated from the light emitting devices (610) via the leads (631, 632). As noted above, if the leads (631, 632) are disposed at a lower surface of the molding apparatus (620), there is an advantage of mounting the light emitting device package on a printed circuit board with solder by flip-chip bonding. A lead (660) is then protruded laterally from the molding apparatus (620) as shown in FIG. 26*b*.

Figure 27:
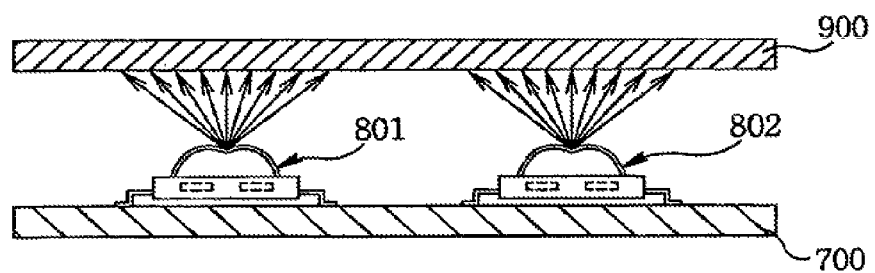
FIG. 27 is a schematic cross-sectional view of a backlight unit using a light emitting device package according to the present invention.

FIG. 27 is a schematic cross-sectional view of a backlight unit using a light emitting device package according to the present invention.

The backlight unit comprises: a substrate (700); a plurality of light emitting device packages (801,802) mounted on an upper surface of the substrate (700); a plurality of optical lenses formed with a surface for refracting light radiated from the plurality of packages (801, 802) and discharging the light to an outside, and also formed thereon with recesses and bonded to upper surfaces of the packages (801, 802); and a diffusion plate (900) disposed above the plurality of optical lenses.

The backlight unit is advantageously operated in such a manner that the light advancing upwards of the light emitting device packages is refracted and discharged upwards of the light emitting device packages with a uniform intensity, whereby a large area can be uniformly illuminated, even with only a small number of light emitting device packages, thereby enabling to improve the backlight light efficiency and power consumption efficiency.

Figure 28:
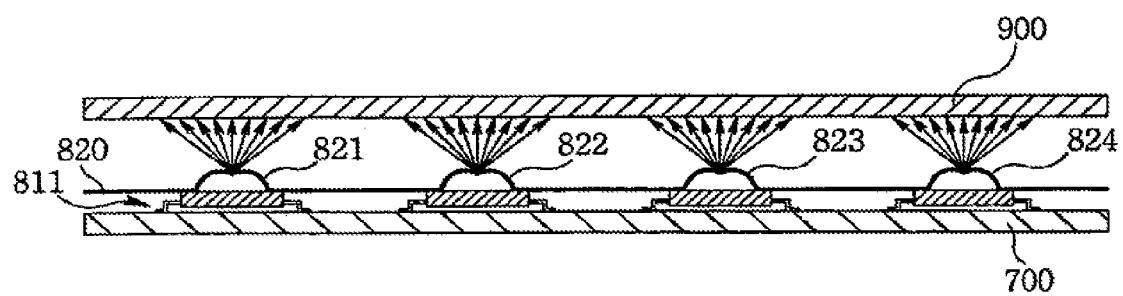
FIG. 28 is a schematic cross-sectional view of another backlight unit using a light emitting device package according to the present invention.

FIG. 28 is a schematic cross-sectional view of another backlight unit using a light emitting device package according to the present invention. The backlight unit comprises: a substrate (700); a plurality of light emitting device packages (811) mounted on an upper surface of the substrate (700); a film (820) formed with a surface for refracting light radiated from the plurality of light emitting device packages (811) and discharging the light to an outside, and also formed thereon with a plurality of optical lens formations (821, 822, 823, 824, 825) each disposed with a recess and positioned on each upper surface of the packages (811); and a diffusion plate (900) disposed above the film (820).

Each of the light emitting device packages (811) is preferred to be packaged with a plurality of light emitting devices, and each optical lens formation on each central axis of the light emitting device packages (811) is formed with a recess.

Therefore, the backlight unit is advantageously operated in such a manner that a plurality of packages fabricated with a plurality of light emitting devices are disposed thereon with an optical lens film integrally formed with optical lens formations for uniformly refracting light to enable to dispense with a process of attaching an optical lens for each package unit.

Figure 29A:
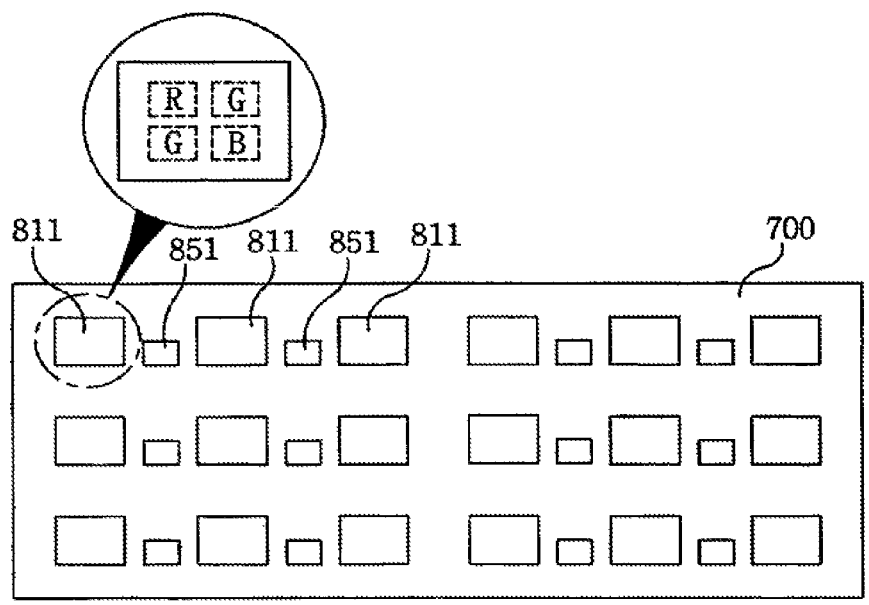
FIGS. 29a and 29b are schematic plans of a backlight unit using light emitting device packages according to the present invention.
Figure 29B:
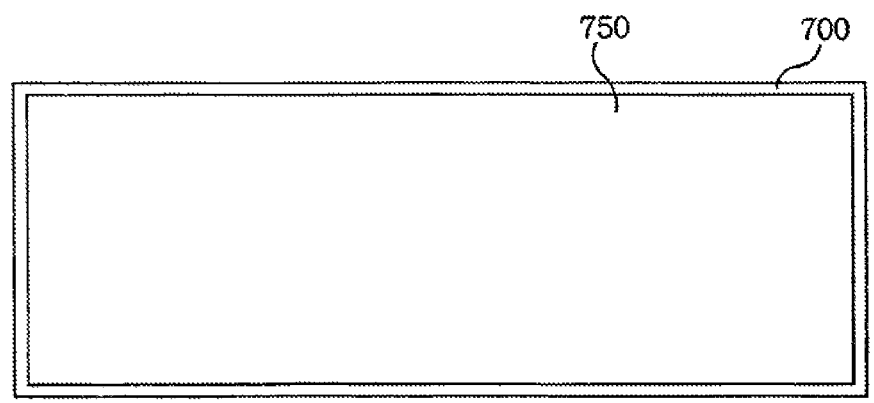

FIGS. 29a and 29b are schematic plans of a backlight unit using light emitting device packages according to the present invention, where a substrate (700) is formed with packages each fabricated with a plurality of light emitting devices. In other words, the plurality of light emitting devices are red (R), green (G) and blue (B) light emitting devices. Furthermore, a driving unit (851) is attached in between the packages for driving the packages (811).

At this time, because each package (811) is formed with a plurality of light emitting devices, the substrate (700) formed with the packages (811) excels a substrate formed with one light emitting device in view of space utility. In other words, as illustrated in FIG. 29a, the present invention is comprised of a backlight unit using the packages (811) packaged with a plurality of light emitting devices, such that a driving unit (851) can be positioned in between the packages (811).

As a result, radiation means (750) may be attached on an entire opposite surface of the substrate (700) formed with the packages (811) to enable to enhance the heat radiation efficiency. To be more specific, if a backlight unit packaged with one light emitting device is constructed, a space utility can be deteriorated over that of the present invention, and a driving unit is positioned on an opposite surface of the substrate packaged with the light emitting device to thereby decrease an area of the radiation means (750).

As apparent from the foregoing, there is an advantage in the light emitting device package and a backlight unit using the same thus described in that light advancing upward from the light emitting device package can be refracted by a lens, thereby enabling the light having a uniform intensity to be emitted upwards to the advantage of efficiency and power consumption, even with a small number of light emitting devices.

There is another advantage in that a plurality of light emitting devices can be clustered into one package, thereby enabling light emitted from each light emitting device to smoothly get mixed, and the light mixed by a lens disposed on the light emitting device package to be uniformly emitted upward.

There is still another advantage in that a film integrally formed with lens formations capable of uniformly refracting light upward from packages mounted with a plurality of light emitting devices is applied to thereby enable to remove a process of attaching lenses to each package unit.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light emitting device package, comprising:
a plurality of light emitting devices on a substrate; and
a plurality of optical lenses respectively disposed over the plurality of light emitting devices, the plurality of respective optical lenses comprising a recessed portion centrally disposed on a top surface of a respective optical lens,
wherein the recessed portion inwardly recesses towards a respective light emitting device,
wherein an upper surface of the respective light emitting device is below a bottom surface of the respective optical lens,
wherein a central axis of the respective light emitting device substantially aligns with a central axis of the recessed portion of the respective optical lens,
wherein the respective optical lens includes:
a body; and
an extending member extending from the body of the respective optical lens,
wherein the extending member comprises a first portion laterally extending in a first direction substantially perpendicular to the central axis of the respective light emitting device, and a second portion extending towards the substrate in a second direction substantially parallel with the central axis of the respective light emitting device,
wherein the first portion is separated from a top surface of the substrate,
wherein the first portion includes a laterally outermost surface of the respective optical lens, a first surface facing the top surface of the substrate, and a second surface opposite to the first surface,
wherein the second portion is disposed between the top surface of the substrate and a plane including the first surface of the first portion, and
wherein a vertical cross section of the second portion is substantially symmetrical with respect to an axis that is spaced apart in the first direction from and substantially parallel with the central axis of the respective light emitting device.

2. The light emitting device package of claim 1, wherein the second portion connects to the top surface of the substrate.

3. The light emitting device package of claim 1, wherein light is configured to be emitted from the respective light emitting device towards the respective optical lens to pass through the respective optical lens to an outside of the respective optical lens.

4. The light emitting device package of claim 1, wherein the recessed portion is part of the entire top surface of the respective optical lens.

5. The light emitting device package of claim 1, wherein the first portion is directly connected to the second portion.

6. The light emitting device package of claim 1, wherein only the second portion contacts the top surface of the substrate.

7. The light emitting device package of claim 1, wherein the second portion includes a bottommost surface of the respective optical lens.

8. The light emitting device package of claim 1, wherein the first portion is spaced apart from the top surface of the substrate.

9. The light emitting device package of claim 1, wherein the second portion extends up to the top surface of the substrate.

10. The light emitting device package of claim 1, wherein at least one of the first portion or the second portion is disposed in a lower region of the respective optical lens with respect to the central axis of the respective light emitting device.

11. The light emitting device package of claim 1, wherein the first and second portions are integral with the respective optical lens.

12. The light emitting device package of claim 1, wherein the respective optical lens further includes a round portion outside of the recessed portion.

13. The light emitting device package of claim 12, wherein the recessed portion is connected to a circumference of the round portion.

14. The light emitting device package of claim 3, wherein the light is configured to be emitted directly to the outside of the respective optical lens without being first reflected by the respective optical lens.

15. The light emitting device package of claim 1, wherein the recessed portion includes a curved or slanting shape.

16. The light emitting device package of claim 1, further comprising a hollow portion into or under which the respective light emitting device is disposed.

17. A light unit, comprising:
a plurality of light emitting devices on a substrate;
a plurality of optical lenses respectively disposed over the plurality of light emitting devices, the plurality of respective optical lenses comprising a recessed portion centrally disposed on a top surface of a respective optical lens, wherein the recessed portion inwardly recesses towards a respective light emitting device; and
a diffusion plate disposed above the plurality of respective optical lenses,
wherein an upper surface of the respective light emitting device is below a bottom surface of the respective optical lens,
wherein a central axis of the respective light emitting device substantially aligns with a central axis of the recessed portion of the respective optical lens,
wherein the respective optical lens includes:
a body; and
an extending member extending from the body of the respective optical lens,
wherein the extending member comprises a first portion laterally extending in a first direction substantially perpendicular to the central axis of the respective light emitting device, and a second portion extending towards the substrate in a second direction substantially parallel with the central axis of the respective light emitting device,
wherein the first portion is separated from a top surface of the substrate,
wherein the first portion includes a laterally outermost surface of the respective optical lens, a first surface facing the top surface of the substrate, and a second surface opposite to the first surface,
wherein the second portion is disposed between the top surface of the substrate and a plane including the first surface of the first portion, and
wherein a vertical cross section of the second portion is substantially symmetrical with respect to an axis that is spaced apart in the first direction from and substantially parallel with the central axis of the respective light emitting device.

18. The light unit of claim 17, wherein the second portion connects to the top surface of the substrate.

19. The light unit of claim 17, wherein light is configured to be emitted from the respective light emitting device towards the respective optical lens to pass through the respective optical lens to an outside of the respective optical lens.

20. The light unit of claim 17, wherein the recessed portion is part of the entire top surface of the respective optical lens.

21. The light unit of claim 17, wherein the first portion is directly connected to the second portion.

22. The light unit of claim 17, wherein only the second portion contacts the top surface of the substrate.

23. The light unit of claim 17, wherein the second portion includes a bottommost surface of the respective optical lens.

24. The light unit of claim 17, wherein the first portion is spaced apart from the top surface of the substrate.

25. The light unit of claim 17, wherein the second portion extends up to the top surface of the substrate.

26. The light unit of claim 17, wherein at least one of the first portion or the second portion is disposed in a lower region of the respective optical lens with respect to the central axis of the respective light emitting device.

27. The light unit of claim 17, wherein the first and second portions are integral with the respective optical lens.

28. The light unit of claim 17, wherein the respective optical lens further includes a round portion outside of the recessed portion.

29. The light unit of claim 28, wherein the recessed portion is connected to a circumference of the round portion.

30. The light unit of claim 19, wherein the light is configured to be emitted directly to the outside of the respective optical lens without being first reflected by the respective optical lens.

31. The light unit of claim 17, wherein the recessed portion includes a curved or slanting shape.

32. The light unit of claim 17, further comprising a hollow portion into or under which the respective light emitting device is disposed.

33. A display, comprising:
a plurality of light emitting devices on a substrate;
a plurality of optical lenses respectively disposed over the plurality of light emitting devices, the plurality of respective optical lenses comprising a recessed portion centrally disposed on a top surface of a respective optical lens, wherein the recessed portion inwardly recesses towards a respective light emitting device;
a diffusion plate disposed above the plurality of respective optical lenses; and
a display panel disposed above the diffusion plate,
wherein an upper surface of the respective light emitting device is below a bottom surface of the respective optical lens,
wherein a central axis of the respective light emitting device substantially aligns with a central axis of the recessed portion of the respective optical lens,
wherein the respective optical lens includes:
a body; and
an extending member extending from the body of the respective optical lens,
wherein the extending member comprises a first portion laterally extending in a first direction substantially perpendicular to the central axis of the respective light emitting device, and a second portion extending towards the substrate in a second direction substantially parallel with the central axis of the respective light emitting device, wherein the first portion is separated from a top surface of the substrate, wherein the first portion includes a laterally outermost surface of the respective optical lens, a first surface facing the top surface of the substrate, and a second surface opposite to the first surface, wherein the second portion is disposed between the top surface of the substrate and a plane including the first surface of the first portion, and wherein a vertical cross section of the second portion is substantially symmetrical with respect to an axis that is spaced apart in the first direction from and substantially parallel with the central axis of the respective light emitting device.

34. The display of claim 33, wherein the second portion connects to the top surface of the substrate.

35. The display of claim 33, wherein light is configured to be emitted from the respective light emitting device towards the respective optical lens to pass through the respective optical lens to an outside of the respective optical lens.

36. The display of claim 33, wherein the recessed portion is part of the entire top surface of the respective optical lens.

37. The display of claim 33, wherein the first portion is directly connected to the second portion.

38. The display of claim 33, wherein only the second portion contacts the top surface of the substrate.

39. The display of claim 33, wherein the second portion includes a bottommost surface of the respective optical lens.

40. The display of claim 33, wherein the first portion is spaced apart from the top surface of the substrate.

41. The display of claim 33, wherein the second portion extends up to the top surface of the substrate.

42. The display of claim 33, wherein at least one of the first portion or the second portion is disposed in a lower region of the respective optical lens with respect to the central axis of the respective light emitting device.

43. The display of claim 33, wherein the first and second portions are integral with the respective optical lens.

44. The display of claim 33, wherein the respective optical lens further includes a round portion outside of the recessed portion.

45. The display of claim 44, wherein the recessed portion is connected to a circumference of the round portion.

46. The display of claim 35, wherein the light is configured to be emitted directly to the outside of the respective optical lens without being first reflected by the respective optical lens.

47. The display of claim 33, wherein the recessed portion includes a curved or slanting shape.

48. The display of claim 33, further comprising a hollow portion into or under which the respective light emitting device is disposed.

* * * * *